(12) United States Patent
Hioki et al.

(10) Patent No.: US 7,264,912 B2
(45) Date of Patent: Sep. 4, 2007

(54) METHOD OF PRODUCING PHOTORESIST

(75) Inventors: Takeshi Hioki, Osaka (JP); Kota Tokuhara, Takatsuki (JP); Yukio Hanamoto, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/117,248

(22) Filed: Apr. 8, 2002

(65) Prior Publication Data

US 2002/0187421 A1  Dec. 12, 2002

(30) Foreign Application Priority Data

Apr. 13, 2001 (JP) ............... 2001-115091
Apr. 13, 2001 (JP) ............... 2001-115092
Apr. 13, 2001 (JP) ............... 2001-115093

(51) Int. Cl.
*G03C 1/73* (2006.01)
*G03F 7/00* (2006.01)

(52) U.S. Cl. .................................. 430/270.1

(58) Field of Classification Search ............ 430/270.1, 430/327; 210/348, 407, 409, 411, 413
See application file for complete search history.

(56) References Cited

U.S. PATENT DOCUMENTS

| | | | | |
|---|---|---|---|---|
| 2,886,178 A | * | 5/1959 | Davis et al. | 210/333.01 |
| 3,613,888 A | * | 10/1971 | Harris | 210/794 |
| 3,704,573 A | * | 12/1972 | Koller et al. | 55/282.4 |
| 4,482,461 A | * | 11/1984 | Hindman et al. | 210/741 |
| 5,368,987 A | * | 11/1994 | Hanamoto et al. | 430/270.1 |
| 5,464,687 A | * | 11/1995 | Sheth | 442/361 |
| 5,556,522 A | * | 9/1996 | Ingalls et al. | 204/665 |
| 5,667,683 A | * | 9/1997 | Benian | 210/409 |
| 6,342,163 B1 | * | 1/2002 | DeLonge et al. | 210/749 |
| 6,436,720 B1 | * | 8/2002 | Oberbeck et al. | 436/180 |

FOREIGN PATENT DOCUMENTS

EP  0 625 568 A1  11/1994
JP  7 118 693 A  5/1995

OTHER PUBLICATIONS

Internet document which shows that CLEARSEP TM cartridge filters used in Hanamoto's Example 1 is made od polypropylene, obtained by the Examiner on the internet.*

* cited by examiner

*Primary Examiner*—Sin Lee
(74) *Attorney, Agent, or Firm*—Birch, Stewart, Kolasch & Birch, LLP

(57) ABSTRACT

Provided are a method of producing a photoresist comprising a process of filtrating a raw resist solution containing resist constituent components and a resist solvent dissolving them, using a filter made of at least one resin selected from fluorine-based resins and polyolefins, wherein this filter has been used for filtration of the same or different kind of other raw resist solution and has been washed with a solvent containing the resist solvent toward the reverse direction to the filtration direction, and a method of sequentially producing two or more photoresists using the same production apparatus, wherein this production apparatus is washed with the resist solvent, a solvent other than this resist solvent capable of dissolving or decomposing the resist constituent components, and the resist solvent, in this order, after production of the photoresist and before production of the subsequent photoresist.

3 Claims, 1 Drawing Sheet

METHOD OF PRODUCING PHOTORESIST

BACKGROUND OF THE INVENTION

1. Field of the Invention

The present invention relates to a method of producing a photoresist, more particularly, to a method of producing a photoresist suitable for lithography acting by a radiation such as ultraviolet ray, far ultraviolet ray, electron beam, X ray and the like.

2. Prior Art

Photoresists have been produced by mixing and dissolving resist constituent components such as a sensitizing agent, alkali-soluble resin, acid generator, quencher and the like into a resist solvent, and filtrating the resulted raw resist solution through a filter made of at least one resin selected from fluorine-based resins and polyolefins, to remove fine particles in the solution.

However, the above-mentioned filter, when used for a filtration operation repeatedly, causes clogging by fine particle arrested on the filter, and further use thereof becomes difficult. Consequently, there is a problem that the filter must be changed frequently, increasing production cost.

The present inventors have intensively studied to solve this problem, and resultantly found that the above-mentioned problem can be solved by washing a filter used once or more times for filtration of a raw resist solution, with a solvent containing the resist solvent, toward the reverse direction to the filtration direction, and filtrating the raw resist solution using this washed filter.

The present inventors have found that a filter used once or more times for filtration of a raw resist solution and washed with a solvent containing the resist solvent toward the reverse direction to the filtration direction can be used also for filtration of an alkali-soluble resin solution. They have also found that further decrease in production cost can be attained by producing a photoresist using thus obtained alkali-soluble resin solution.

Further, conventionally, when, after production of a photoresist, the same or different kind of photoresist is produced subsequently using the same production apparatus, even if a resist solvent for the photoresist in the former production and a resist solvent for the photoresist in the latter production are the same, it is necessary to sufficiently wash the production apparatus after production of the photoresist in the former production and before production of the photoresist in the latter production. If this washing is insufficient, various problems occur such as increase by time in the number of particles in the resist solution, deterioration in lithography ability, and the like.

Particularly, in the case of sequential production of two or more photoresists having mutually different resist constituent components using the same production apparatus, if washing thereof is insufficient, a problem occurs that resist constituent components of a photoresist in the former production are mixed into a photoresist in the subsequent production. Accordingly, respective photoresists are often produced by using different production apparatuses, in such a case. According to this method, however, it is required to provide a lot of production apparatuses for producing many articles of photoresists, being unsatisfactory from the standpoint of production efficiency.

The present inventors have further found that if, in a method of sequentially producing two or more photoresists having mutually the same or different resist constituent components and using mutually the same resist solvent by using the same production apparatuses, this production apparatus is washed with the resist solvent, a solvent other than this resist solvent capable of dissolving or decomposing the resist constituent components, and the resist solvent, in this order, after production of the photoresist and before production of the subsequent photoresist, sufficient washing can be attained and the problem in the case of sequential production using the same production apparatus can be solved.

The present invention has been completed based on these findings.

SUMMARY OF THE INVENTION

The present invention provides, in a first embodiment thereof, a method of producing a photoresist comprising a process of filtrating a raw resist solution containing resist constituent components and a resist solvent dissolving them, using a filter made of at least one resin selected from fluorine-based resins and polyolefins, wherein this filter has been used for filtration of the same or different kind of other raw resist solution and has been washed with a solvent containing the resist solvent toward the reverse direction to the filtration direction.

The present invention provides, in a second embodiment thereof, a method of producing an alkali-soluble resin solution comprising a process of filtrating a raw alkali-soluble resin solution obtained by dissolving an alkali-soluble resin in a solvent, using a filter made of at least one resin selected from fluorine-based resins and polyolefins, the filter having been used for filtration of a raw resist solution containing the same kind of resist solvent as the above-mentioned solvent and washed with a solvent containing the resist solvent toward the reverse direction to the filtration direction, after filtration.

The present invention also provides, in a third embodiment thereof, a method of producing a photoresist comprising sequentially producing two or more kinds of photoresists containing resist constituent components and a resist solvent dissolving them in which the resist constituent components are mutually the same or different and the resist solvents are mutually the same using the same production apparatus, wherein this production apparatus is washed with the resist solvent, a solvent other than this resist solvent capable of dissolving or decomposing the resist constituent components, and the resist solvent, in this order, after production of the photoresist and before production of the subsequent photoresist.

Figure 1:
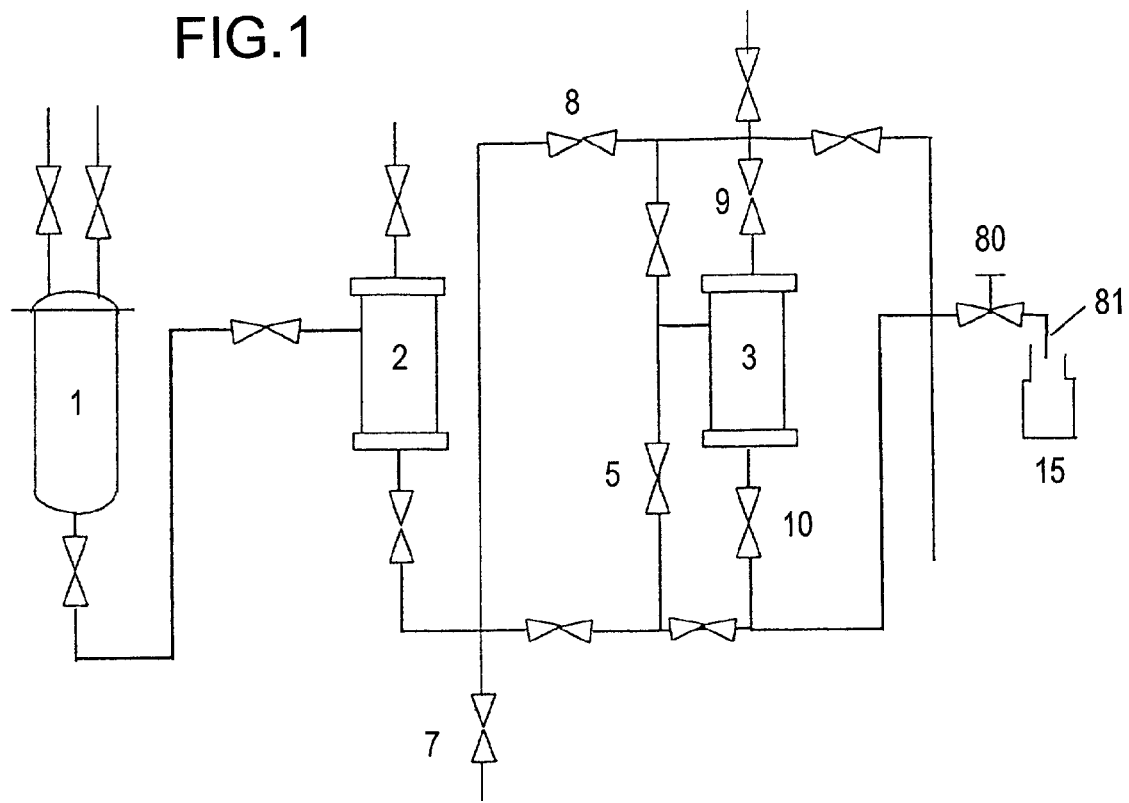
FIG. 1 is a schematic view of a photoresist production apparatus used in reference examples and examples.

EXPLANATION OF REMARKS (1): Vessel
(2): Filter housing
(3): Filter housing
(4): Reverse washing inlet
(5): Switching valve
(6): Pressure controlling valve
(7) to (11): Switching valve
(15): Resist filling vessel
(80): Flow control valve
(81): Filling nozzle

DETAILED DESCRIPTION OF PREFERRED EMBODIMENTS

The raw resist solution in the present invention contains resist constituent components and a resist solvent dissolving them.

Here, the resist constituent components mean those dissolved in a resist solvent to constitute a photoresist, and vary depending on the kind of the intended photoresist and are not particularly restricted. For example, in the case of photoresists applied to lithography using g-line and i-line, listed are alkali-soluble resins such as novolak and the like, quinonediazide-based photosensitive agents and other components. In the case of photoresists applied to lithography using far ultraviolet ray, listed are acid generators, resins, quenchers and other components.

More specific examples of the photosensitive agents used in photoresists applied to lithography using g-line and i-line include quinonediazidesulfonates and quinonediazidesulfonic amides such as o-benzoquinonediazidesulfonates, o-benzoquinonediazidesulfonic amides, o-naphthoquinonediazidesulfonates and o-naphthoquinonediazidesulfonic amides.

As the alkali-soluble resin, there are listed, for example, novolak resins obtained by poly-condensing phenols or cresols with formaldehyde or formaldehyde precursor in the presence of an acid catalyst such as p-toluenesulfonic acid, acetic acid, hydrochloric acid or sulfuric acid, and the like.

Examples of the acid generators in photoresists (positive resist composition of chemical amplification type, and the like) applied to lithography using far ultraviolet ray include onium salts compounds, organic halogen compounds, sulfone compounds, sulfonate compounds and the like. Specifically, 2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine, 1-benzoyl-1-phenylmethyl p-toluenesulfonate (commonly called benzoin tosylate),
2-benxzoyl-2-hydroxy-2-phenylethyl p-toluenesulfonate (commonly called α-methylolbenzoin tolylate),
1,2,3-benzenetoluyl trismethanesulfonate,
2,6-dinitrobenzyl p-toluenesulfonate, 2-nitrobenzyl p-toluenesulfonate, 4-nitrobenzyl p-toluenesulfonate, dipheyl disulfone, di-p-tolyl disulfone,
bis(pheylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxy imide, N-(trifluoromethylsulfonyloxy)naphthalimide,
N-(10-camphorsulfonyloxy)naphthalimide and the like are listed.

The resin for a chemical amplification type resist is, in general, insoluble or poorly soluble itself in alkali, however, groups are partially cleaved by the action of an acid, to give alkali-solubility after cleavage. Groups cleaved by the action of an acid are known in the filed of resists. For example, alkyl groups branched at 1-position such as tert-butyl; 1-alkoxyalkyl groups optionally further substituted such as 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl and 1-[2-(1-adamantanecarbonyloxy)ethoxy]ethyl; residual groups of non-aromatic cyclic compounds such as tetrahydro-2-furanyl, tetrahydro-2-pyranyl, 3-oxocyclohexyl, 4-methyltetrahydro-2-pyron-4-yl (derived from mevalonic lactone) and 2-methyl-2-adamantyl, and the like are listed. The groups shall be substituted for hydrogen of a carboxyl group or alcoholic hydroxyl group in a resin or monomer. When a monomer having such a group is prepared, it is copolymerized with other monomer, to give a resin used in the present invention.

It is known that, generally in a positive resist composition of chemical amplification type, ability deterioration due to deactivation of an acid by leaving after exposure can be improved by adding as a quencher basic compounds, particularly basic nitrogen-containing organic compounds, for example, amines.

The resist solvent is a solvent dissolving the above-mentioned resist constituent components. As the resist solvent, propylene glycol monomethyl ether acetate, propylene glycol monoethyl ether acetate, acetone, methyl isobutyl ketone, 2-heptanone, cyclohexanone, γ-butyrolactone, ethyl lactate, butyl acetate, amyl acetate, ethyl pyruvate, diethylene glycol dimethyl ether, methylcellosolve acetate and ethylcellosolve acetate and the like are exemplified. In addition to individual use of them, a mixed solvent of two or more of them can also be used.

The raw resist solution in the present invention is obtained, for example, by mixing and dissolving resist constituent components and a resist solvent. There are also adopted a method in which parts of resist constituent components are dissolved in a resist solvent, and this solution is mixed with other resist constituent components and/or remaining resist solvent to give dissolution, a method in which resist constituent components are respectively dissolved in portions of a resist solvent, and the resulted solutions are mixed, and other methods.

As the apparatus for producing a positive resist solution used in the present invention, there are preferably listed those containing a resist solution preparation apparatus for preparing a raw resist solution, a filter for filtrating the resist solution, and the like, and for example, an apparatus as illustrated in FIG. 1 is mentioned. A vessel (1) in FIG. 1 is a resist solution preparation apparatus (mixing bath), and a filter is mounted to filter housings (2) and (3).

In the example of FIG. 1, two valves are provided above the vessel (1). Therefore, a solution prepared by dissolving one of resist constituent components (for example, alkali-soluble resin) in a part of a resist solvent (for example, 2-heptanone) is fed from one of the above-mentioned two valves and a solution prepared by dissolving the other resist constituent component (for example, photosensitive agent) in a part of the resist solvent is fed from another valve, and they can be mixed in the vessel (1).

In the present invention, the term "mutually the same resist constituent component" means a case in which main components in resist constituent components are all the same, and the term "mutually different resist constituent components" means a case in which at least one component in main components in resist constituent components is different. The main components are, in the case of a photoresist applied to lithography using g-line or i-line, an alkali-soluble resin component and a photosensitive agent component.

Likewise, the term "mutually the same resist solvent" means a case in which main components in a resist solvent are all the same, and the term "mutually different resist solvents" means a case in which at least one component in main components in a resist solvent is different.

Further, the terms "the same photoresist and raw resist solution" mean a photoresist and raw resist solution in which main components in resist constituent components and main components in a resist solvent are all the same, and the terms "different photoresist and raw resist solution" mean a photoresist and raw resist solution in which at least one of main components in resist constituent components and main components in a resist solvent is different.

The filter used in the present invention is made of at least one resin selected from fluorine-based resins and polyolefins.

As the fluorine-based resin, polytetrafluoroethylene is exemplified. As the filter made of polytetrafluoroethylene preferably used, for example, ABD1UFD3E [manufactured by Nippon Pole K.K.], ABD1UFT3EN [manufactured by Nippon Pole K.K.] and the like are listed. The pore diameter is usually from about 0.01 to 1 μm, preferably from about 0.1 to 0.2 μm.

As the polyolefin, for example, polyethylene is exemplified. As the filter made of polyethylene preferably used in the present invention, for example, SH4M228J3 [manufactured by Nippon Millipore K.K.], CS09XFE [manufactured by Mitsubishi Chemical Co., Ltd.], CS20XFE [manufactured by Mitsubishi Chemical Co., Ltd.], and the like are listed. The pore diameter is usually from about 0.01 to 0.2 μm.

In the example of FIG. 1, a filter is mounted to filter housings (2) and (3). A uniformly mixed raw resist solution is transferred to the filter housing, and filtrated through a filter in this filter housing, to remove fine particles. One filter or a plurality of filters may be provided in the filter housing, and preferably filters are connected in parallel.

Though not shown in FIG. 1, it may also be permissible that a storage tank is newly provided between the filter housing (2) and the filter housing (3) and a solution filtrated through a filter is once stored in this tank. The solution filtrated in the filter housing (2) and once stored in the storage tank is preferably filtrated in another filter housing (3) via a valve (5), likewise in the case of the filter housing (2).

The solution filtrated in the filter housing (3) is filled, via a valve (10), in a resist vessel by a resist solution filling apparatus having a valve (80) which can control flow amount, and a resist vessel (15) or a filling nozzle (81), movably designed at given positions.

In production of a photoresist, filtration may be effected by two or more filters. Particularly preferable is a method in which a raw resist solution is once passed through a filter made of a fluorine-based resin, then, passed through a filter made of a polyolefin. Alternatively, it may also be permissible that a certain filter is provided for the main purpose of cutting fine particles derived from a solvent and another filter is provided for the main purpose of cutting other fine particles.

The first embodiment of the present invention is characterized in re-use a filter which has been used for filtration of the same or different kind of other raw resist solution and then has been washed (reverse-washed) with a solvent containing the resist solvent toward the reverse direction to the filtration direction.

When two or more filters are used in producing a photoresist, a case of reverse-washing part of them, for example, only one filter for re-use thereof is also include in the present invention. For example, when a certain filter is provided for the main purpose of cutting fine particles derived from a solvent and another filter is provided for the main purpose of cutting other fine particles, only this another filter may be reverse-washed and re-used.

When two or more filters are used and only part of them is reverse-washed and re-used, the filter to be reverse-washed and re-used is preferably a filter made of polyethylene.

A case of reverse-washing a filter which has been used twice or more times for filtration of other raw resist solutions and re-using the washed filter is also included in the present invention.

In the first embodiment of the present invention, the solvent used for reverse washing of a filter is a solvent containing a resist solvent.

In the case of production of a resist containing an alkali-soluble resin and a quinonediazide-based photosensitive agent such as in the case of a photoresist applied for lithography using g-line or i-line, it is preferable to use N-methylpyrrolidone together with a resist solvent, as the solvent used for reverse washing. A resist solvent and N-methylpyrrolidone may be used in the form of a mixture of them, however, it is usually preferable to use them individually alone, and it may also be permissible to effect washing with a resist solvent and washing with N-methylpyrrolidone, sequentially. Particularly preferable is a method of conducting washings with a resist solvent, N-methylpyrrolidone and resist solvent in this order each several times.

Though photosensitive agent components such as
o-benzoquinonediazidesulfonates,
o-benzoquinonediazidesulfonic amides,
o-naphthoquinonediazidesulfonates and
o-naphthoquinonediazidesulfonic amides and the like tend relatively to be a cause for increase in the number of fine particles in a photoresist solution, efficient reverse-washing becomes possible by using N-methylpyrrolidone since photosensitive agent components remaining in a filter are easily decomposed by N-methylpyrrolidone.

The amounts of a resist solvent and N-methylpyrrolidone used for reverse-washing of a filter are not particularly restricted. However, in the case of conducting washings with a resist solvent, N-methylpyrrolidone and resist solvent in this order each several times, the first washing with a resist solvent is preferably conducted at amount and cycles so that the photosensitive agent concentration in the washing solution is 10 ppm or less, and the latter washing with a resist solvent is preferably conducted at amount and cycles so that the amount of N-methylpyrrolidone in the washing flow solution is not more than the tolerance. Washing with N-methylpyrrolidone is conducted until the amount of photosensitive agent components in the washing solution becomes preferably 200 ppm or less, more preferably 1 ppm or less, further preferably 0.1 ppm or less.

In the case of a resist containing an acid generator, quencher, alkali-soluble resins and the like such as a photoresist applied for lithography using a far ultraviolet ray, it is preferable to use ketones or alcohols together with a resist solvent, as the solvent used for reverse washing. As the ketones, acetone is preferably exemplified.

The resist solvent and ketones may be used in the form of a mixed solvent thereof, however, it is usually preferable to use them individually alone, and it may also be permissible to effect washing with a resist solvent and washing with ketones, sequentially.

Particularly preferable is a method of conducting washings with a resist solvent, ketones and resist solvent in this order each several times.

The amounts of a resist solvent and ketones or alcohols used for reverse washing of a filter are not particularly restricted. However, in the case of conducting washings with a resist solvent, ketones or alcohols and resist solvent in this order each several times, the first washing with a resist solvent is preferably conducted at amount and cycles so that the photosensitive agent concentration in the washing solution is 10 ppm or less, and the latter washing with a resist solvent is preferably conducted at amount and cycles so that the amount of ketones or alcohols in the washing flow solution is not more than the tolerance. Washing with ketones or alcohols is conducted until the amount of photosensitive agent components in the washing solution becomes preferably 200 ppm or less, more preferably 1 ppm or less, further preferably 0.1 ppm or less.

The first embodiment of the present invention is preferable since the amount of a solvent necessary for production can be reduced and the production time cycle can be improved by using, as the solvent used for washing of a filter, a solvent which has been used for washing of a part coming into contact with a raw resist solution, in an apparatus used for production of a raw resist solution and/or feeding of a raw resist solution to a filter.

Here, as the apparatus used for production of a raw resist solution, a resist solution preparation apparatus (mixing bath) for mixing and dissolving the above-mentioned resist constituent components and resist solvent is exemplified. In FIG. 1, the vessel (1) corresponds to the resist solution preparation apparatus (mixing bath). As the apparatus used for feeding of a raw resist solution to a filter, a piping connecting a mixing bath to the inlet of an apparatus accommodating a filter (filter housing and the like), and appended valves and the like are exemplified.

The second embodiment of the present invention is a method of producing an alkali-soluble resin solution characterized in that it comprises a process of filtrating a raw alkali-soluble resin solution obtained by dissolving an alkali-soluble resin in a solvent, using a filter made of at least one resin selected from fluorine-based resins and polyolefins, the filter having been used for filtration of a raw resist solution containing the same kind of resist solvent as the above-mentioned solvent and washed with a solvent containing the resist solvent toward the reverse direction to the filtration direction, after filtration.

Thus produced alkali-soluble resin solution can be used for production of a raw resist solution, by mixing and dissolution of other resist constituent components and resist solvent. Then, a photoresist can be produced from this raw resist solution, and also to this production of a photoresist, the first embodiment of the present invention can be applied.

As the filter used in the second embodiment of the present invention, the same filter as that reverse-washed and re-used in the first embodiment is used and preferable. Further, a filter which has been re-used for may times and revealed difficultly in use for the first embodiment can also be used in this second embodiment, in some cases.

As the solvent used for reverse washing of a filter used in the second embodiment of the present invention, the same solvent as that used for reverse washing of a filter in the first embodiment is used and preferable.

As the apparatus used for producing a photoresist in the third embodiment of the present invention, a usual photoresist production apparatus as shown in FIG. 1 is exemplified.

As the solvents other than this resist solvent and capable of dissolving and decomposing the resist constituent components, N-methylpyrrolidone, dimethylformamide, sulfolane and the like are exemplified, and N-methylpyrrolidone is preferable.

EXAMPLES

The present invention will be illustrated further in detail by way of examples and the like, below. The scope of the present invention is not limited to the examples.

Reference Example 1

Into a filter housing (3) of an apparatus in FIG. 1 was placed a filter SH4M228J3 made of polyethylene [pore diameter: 0.2 µm, manufactured by Nippon Microlis K.K.]. This polyethylene filter had been used for filtrating a raw photoresist solution once to obtain PFI-32A6 manufactured by Sumitomo Chemical Co., Ltd. [positive photoresist composed of alkali-soluble novolak resin, quinonediazidesulfonate-based photosensitive agent and 2-heptanone]. In a vessel (1) was stored the above-mentioned PFI-32A6 (raw resist solution) prepared by mixing an alkali-soluble novolak resin, quinonediazidesulfonate-based photosensitive agent and 2-heptanone and the like.

2-heptanone, N-methylpyrrolidone and 2-heptanone were allowed to flow in this order through valves and piping from the vessel (1) into the filter housing (2) and valves and piping (bold line in FIG. 1) from the filter housing (2) into the filter housing (3), to the flow direction in the order of (10), (3), (9), (8), (2) and (1), to perform reverse washing.

The first washing with 2-heptanone (hereinafter, referred to as coarse washing) was conducted three times, and 2-heptanone was used in amounts of 14.1 kg, 7.4 kg and 8.4 kg, respectively. The second washing with N-methylpyrrolidone (hereinafter, referred to NMP washing) was conducted twice, and NMP was used in amounts of 5.4 kg and 7 kg, respectively. The third washing with 2-heptanone (hereinafter, referred to as substitution washing) was conducted seven times, and 2-heptanone was used in amounts of 5 kg, 6.2 kg, 6 kg, 7.2 kg, 6 kg, 8 kg and 7 kg, respectively.

The photosensitive agent concentration in the washing solution obtained after the second coarse washing was 0.4 ppm, and no photosensitive agent was detected in the washing solution obtained after the third coarse washing. The NMP concentration in the washing solution obtained after the first substitution washing was 2807 ppm, the NMP concentration in the washing solution obtained after the fourth substitution washing was 93 ppm and the NMP concentration in the washing solution obtained after the seventh substitution washing was 29 ppm. The filter housing (2) is provided for the main purpose of cutting fine particles derived from a solvent.

Example 1

Using an apparatus (FIG. 1) having a filter housing (3) containing the polyethylene filter SH4M228J3 (re-use material) installed therein obtained in Reference Example 1, a raw photoresist solution of the same kind as the raw photoresist solution used in Reference Example 1 was allowed to flow according to a one path mode by nitrogen gas press, toward the flow direction of the order of (1), (2), (8), (9), (3) and (10), and filtrated, resulting in a photoresist product containing little fine particles having diameters of 0.2 μm or more.

The filter housing (2) is provided for the main purpose of cutting fine particles derived from a solvent constituting the raw resist.

Though, in this example, filtration was conducted according to a one path mode by nitrogen gas press, a photoresist product containing little fine particles is obtained like in the one path mode even if filtration is conducted according to a circulation mode using a pump.

Reference Example 2

Using the apparatus in FIG. 1, filtration of a raw photoresist solution was conducted, to obtain PFI-32A6. In the vessel (1) was stored the above-mentioned PFI-32A6 (raw photoresist solution) prepared by mixing an alkali-soluble novolak resin, quinonediazidesulfonate-based photosensitive agent and 2-heptanone and the like. In the filter housing (3), SH4M228J3 made of polyethylene [pore diameter: 0.2 μm, manufactured by Nippon Microlis K.K.] was installed as a filter, and the above-mentioned polyethylene filter had already been used once for filtration of a raw photoresist solution and wetted. The filter housing (2) is provided for the main purpose of cutting fine particles derived from a solvent.

Subsequently, the valve (5) was closed and the valve (11) positioned at lower right of the valve (5) was opened, and under this condition, 2-heptanone, N-methylpyrrolidone and 2-haptanone were used in this order to wash flow routes from the vessel (1) containing the above-mentioned stored residue of the raw photoresist, via the filter housing (2), to the valve (5) positioned beneath the filter housing (3).

After coarse washing with 14.1 kg of 2-heptanone, the washing solution was recovered. This was called recovered 2-heptanone A.

Next, washing was conducted twice using N-methylpyrrolidone in amounts of 5.4 kg and 7 kg, respectively, (hereinafter, referred to as NMP washing) and the washing solutions were recovered. These were combined to give recovered NMP.

Finally, substitution washing with 2-heptanone was repeated seven times, and 2-heptanone was used in amounts of 5 kg, 6.2 kg, 6 kg, 7.2 kg, 6 kg, 8 kg and 7 kg, in this order. The sixth washing solution and the seventh washing solution were combined to give recovered 2-heptanone B.

The photosensitive agent concentration in the recovered 2-haptanone obtained after the coarse washing was 1.5 ppm. No photosensitive agent was detected in the recovered NMP. The NMP concentration in the solution obtained after the first substitution washing was 2807 ppm, the NMP concentration in the solution obtained after the sixth substitution washing was 59 ppm and the NMP concentration in the solution obtained after the seventh substitution washing was 29 ppm.

Reference Example 3

Using the apparatus in FIG. 1, the recovered 2-heptanone A, recovered NMP and recovered 2-heptanone B obtained in Reference Example 2 were used in this order to reverse-wash the polyethylene filter accommodated In the filter housing (3) (SH4M228J3 used for filtration of a raw photoresist solution in Reference Example 2). Specifically, the above-mentioned recovered solvents were passed through routes of the valve (7), valve (8), valve (9), filter housing (3) and valve (10), to obtain about 14 kg of a recovered 2-haptanone A washing solution, about 12 kg of a recovered NMP washing solution and about 15 kg of a recovered 2-heptanone B washing solution, respectively.

After reverse washing with the above-mentioned recovered solvents, the above-mentioned recovered solvent washing solutions were distilled, to obtain about 13 kg of distilled 2-heptanone A, about 11 kg of distilled NMP and about 14 kg of distilled 2-heptanone B.

Then, of these distilled solutions, about 7 kg of NMP and about 26 kg of 2-heptanone were used in this order, and the above-mentioned distilled solvents were passed through routes of the valve (7), valve (8), valve (9), filter housing (3) and valve (10) to reverse-wash the polyethylene filter (SH4M228J3), giving about 7 kg of a recovered NMP washing solution and about 26 kg of a recovered 2-haptanone washing solution.

Example 2

Using an apparatus (FIG. 1) having a filter housing (3) containing the polyethylene filter SH4M228J3 (re-use material) installed therein obtained in Reference Example 3, a raw photoresist solution of the same kind as the raw photoresist solution used in Reference Example 2 was allowed to flow according to a one path mode by nitrogen gas press, toward the flow direction of the order of (1), (2), (8), (9), (3) and (10), and filtrated, resulting in a photoresist product containing little fine particles having diameters of 0.2 μm or more.

The filter housing (2) is provided for the main purpose of cutting fine particles derived from a solvent constituting the raw resist.

Though, in this example, filtration was conducted according to a one path mode by nitrogen gas press, a photoresist product containing little fine particles is obtained like in the one path mode even if filtration is conducted according to a circulation mode using a pump.

Reference Example 4 <Test of Confirming Break of Filter Fine Pore Structure Influencing Particle Removal Ability>

Figure 2:
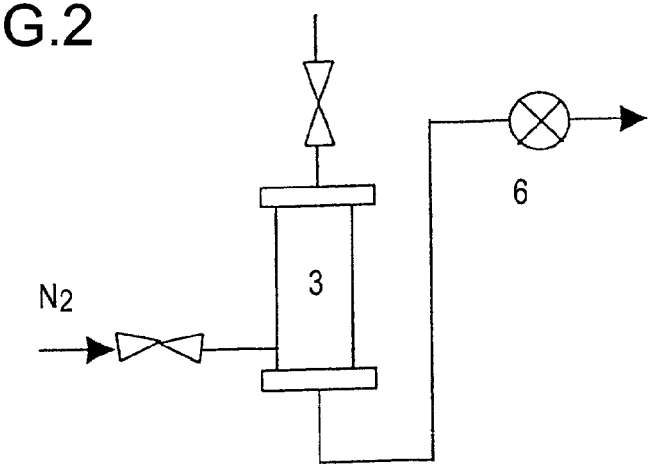
FIG. 2 shows an apparatus used in Reference Example 4.

A polyethylene filter SH4M228J3 (obtained by wetting an article directly after purchase with 2-heptanone) and the polyethylene filters SH4M228J3 after reverse washing obtained in Reference Examples 1 and 3 (hereinafter, referred to as re-use material) were installed respectively in the filter housing (3) in FIG. 2, and the following test was conducted using the apparatus illustrated in FIG. 2.

The above-mentioned installed filter was pressed at a nitrogen pressure of 150 kPa by introducing a nitrogen gas for certain time through a valve (4) provided at the side of the filter housing (3) and controlling the valve (6), then, the diffusion passed gas amount was measured to test break in the filter fine pore structure. The diffusion passed gas amount of the re-use material was not more than the diffusion passed gas amount of the new filter, to confirm no break of the fine pore structure of the filter.

Reference Example 5

The polyethylene filters SH4M228J3 obtained in Reference Examples 1 and 3 (re-use materials) were immersed in PFI-32A6, and change by time of the number of fine particles having particle sizes of 0.2 μm or more was measured. Likewise, change by time of the number of fine particles having particle sizes of 0.2 μm or more was measured also with PFI-32A6 into which no filter had been immersed. The increases in the number of fine particles are shown in Table 1.

TABLE 1

|  | Non-immersion material | Reference Example 1 | Reference Example 3 |
| --- | --- | --- | --- |
| 5° C. for 20 days | 0/ml | 54/ml | 50/ml |
| 23° C. for 45 days | 4/ml | 0/ml | 0/ml |
| 40° C. for 9 days | 1/ml | 0/ml | 0/ml |

No significant difference is observed in increase in the number of fine particles between the non-immersion material and the immersion material. This results teaches that even if this filter is used for filtration of a photoresist solution, increase in the number of fine particles is not caused.

Example 3

In the vessel (1) of the apparatus shown in FIG. 1 [The polyethylene filters SH4M228J3 obtained in Reference Examples 1 is installed in the filter housing (3). The filter housing (2) is provided for the main purpose of cutting fine particle derived from a solvent constituting a raw resist.], an alkali-soluble novolak resin which is a constituent component of PFI-32A6 and 2-heptanone which is a solvent component were mixed to prepare a resin solutions.

This resin solution was filtrated according to a one pass mode by nitrogen gas press, to obtain a resin solution containing little fine particles. Though, in this example, filtration was conducted according to a one path mode by nitrogen gas press, a resin solution containing little fine particles is obtained like in the one path mode even if filtration is conducted according to a circulation mode using a pump.

The resulted resin solution containing little fine particles and a 2-heptanone solution of a photosensitive agent (constituent component of PFI-32A6) were mixed in the vessel (1), to obtain a raw photoresist solution. This raw photoresist solution was passed through in the filter housing (3) having a re-use material filter installed, to obtain a photoresist product containing little fine particles having particle sizes of 0.2 μm or more.

Though, in this example, filtration was conducted according to a one path mode by nitrogen gas press, a photoresist product containing little fine particles is obtained like in the one path mode even if filtration is conducted according to a circulation mode using a pump.

According to the present invention, a photoresist product can be produced industrially advantageously.

What is claimed is:

1. A method of producing a photoresist comprising sequentially producing two or more photoresists containing resist constituent components and a resist solvent dissolving the components in which the resist constituent components are mutually the same or different and the resist solvents are mutually the same using the same production apparatus, wherein this production apparatus is washed with the resist solvent, a solvent other than this resist solvent capable of dissolving or decomposing the resist constituent components, and the resist solvent, in this order, after production of the photoresist and before production of the subsequent photoresist.

2. The method of producing a photoresist according to claim 1 wherein the solvent other than the resist solvent capable of dissolving or decomposing the resist constituent components contains N-methylpyrrolidone.

3. The method of producing a photoresist according to claim 1 wherein the solvent other than the resist solvent capable of dissolving or decomposing the resist constituent components contains ketones.

* * * * *